United States Patent [19]

Tanaka et al.

[11] Patent Number: 4,631,617
[45] Date of Patent: Dec. 23, 1986

[54] MAGNETO-OPTICAL RECORDING MEDIUM

[75] Inventors: Fujio Tanaka; Nobutake Imamura, both of Tokyo, Japan

[73] Assignee: Kokusai Denshin Denwa Kabushiki Kaisha, Tokyo, Japan

[21] Appl. No.: 509,189

[22] Filed: Jun. 29, 1983

[30] Foreign Application Priority Data

Sep. 14, 1982 [JP] Japan ............... 57-160422

[51] Int. Cl.$^4$ ............ G11B 5/74; G11B 5/66
[52] U.S. Cl. ................. 360/131; 428/694; 428/900
[58] Field of Search ......... 360/131, 134, 135, 136; 369/13; 428/900, 692, 694; 365/122, 10, 32

[56] References Cited

U.S. PATENT DOCUMENTS

| | | | |
|---|---|---|---|
| 4,390,600 | 6/1983 | Ohta et al. | 428/900 |
| 4,414,650 | 11/1983 | Ohta et al. | 365/122 |
| 4,466,035 | 8/1984 | Connell et al. | 369/13 |
| 4,579,777 | 4/1986 | Honguu et al. | 428/336 |

FOREIGN PATENT DOCUMENTS 0066549 4/1982 Japan ........................... 369/13

Primary Examiner—Robert S. Tupper
Assistant Examiner—Andrew L. Sniezek
Attorney, Agent, or Firm—Robert E. Burns; Emmanuel J. Lobato; Bruce L. Adams

[57] ABSTRACT

A magneto-optical recording medium, in which a transparent synthetic resin substance, a light transparent thin film of a simple substance of metal or a metal compound, a dielectric layer, a recording medium layer formed of an amorphous alloy having an easy axis of magnetization in a direction perpendicular to the layer surface and thick enough to reflect light, and a protective film are provided in this order from the light incidence side. The dielectric layer may be provided with an auxiliary recording medium layer formed of the amorphous alloy having an easy axis of magnetization in the direction perpendicular to the layer surface and thin enough to permit the passage therethrough of light.

2 Claims, 4 Drawing Figures

MAGNETO-OPTICAL RECORDING MEDIUM

BACKGROUND OF THE INVENTION

The present invention relates to a magneto-optical recording medium for use as a magneto-optical memory, a magnetic recording and display element and so forth and, more particularly, to improvement in a magnetic thin film recording medium which has an easy axis of magnetization in a direction perpendicular to the film surface and permits recording of information by forming an inverted magnetic domain of a circular or arbitrary configuration and readout of the information through utilization of the magnetic Kerr effect or like magneto-optic effect.

With ferromagnetic thin films having the easy axis of magnetization in a direction perpendicular to the film surface, it is possible to form small inverted magnetic domains which have a magnetic pole reverse from a uniform magnetization polarity in the film surface uniformly magnetized with south or north magnetic pole. By making the presence and absence of the inverted domains correspond to binary information "1" and "0", respectively, such ferromagnetic thin films can be used as high density magnetic recording media. Of such ferromagnetic thin films, thin films which have a large coercive force at room temperature and have a Curie point or magnetic compensation temperature relatively close to room temperature permit recording of information by forming inverted magnetic domains at arbitrary positions with a light beam through utilization of the Curie point or magnetic compensation temperature; therefore, they are generally used as beam addressable files.

Conventionally known ferromagnetic thin films which have an easy axis of magnetization in a direction perpendicular to the film surface and can be used as beam addressable files are polycrystalline metal thin films represented by MnBi, amorphous metal thin films, such as Gd-Co, Gd-Fe, Tb-Fe, Dy-Fe, etc., and compound single crystal thin films represented by GIG Gadolinium Iron Garmet.

Furthermore, amorphous alloy thin films containing 15 to 30% atoms of Tb or Dy, such as TbFe and DyFe, have been proposed as new magnetic thin film recording media. On account of the following merits, the amorphous alloy thin films are regarded as promising as magneto-optical recording media.

(1) Since they have the easy axis of magnetization in the direction perpendicular to the film surface and have a large coercive force of several kilooersteds at room temperature, information can be recorded with high density and the recorded information is very stable.

(2) The coercive force is large so that magnetic domain of desired configuration can be written.

(3) Since they have a large coercive force over a wide range of composition and have excellent characteristics as recording media over a wide range of composition, they need not be severely restricted in composition and can be readily fabricated at a good yield rate.

(4) Since the Curie point is as low as 120° C. in the TbFe and 60° C. in the DyFe, a thermal writing operation utilizing the Curie point can be effected with very small energy.

However, the amorphous alloy thin films, such as the TbFe, DyFe, etc., have the following drawbacks: That is to say, it is true that a low Curie point permits a writing operation with small energy, but it impairs the SN ratio in case of reading out information by light.

SUMMARY OF THE INVENTION

In view of the above-described prior art, it is an object of the present invention to provide a magnetic recording medium which permits an increase in the apparent Kerr rotational angle to improve the SN ratio of the reproduced output light and is high in long-term reliability.

In accordance with the present invention, there is provided a magneto-optical recording medium in which a transparent synthetic resin substrate, a light transparent thin film of a simple substance of metal or a metal compound, a dielectric layer, a recording medium layer formed of an amorphous alloy having an easy axis of magnetization in a direction perpendicular to the layer surface and thick enough to reflect light, and a protective film are provided in this order from the light incidence side. The dielectric layer may be provided with an auxiliary recording medium layer formed of the amorphous alloy having an easy axis of magnetization in the direction perpendicular to the layer surface and thin enough to permit the passage therethrough of light.

BRIEF DESCRIPTION OF THE DRAWINGS

The present invention will be described in detail below in comparison with conventional arts with reference to the accompanying drawings, in which.

DETAILED DESCRIPTION

To make differences between conventional art and the present invention clear, conventional art will first be described.

Figure 1:
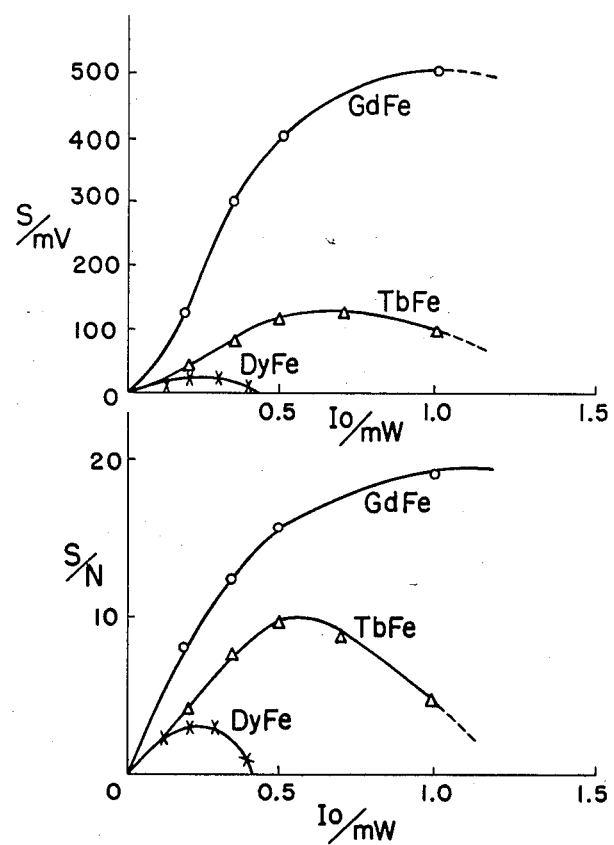
FIG. 1 is a characteristic diagram showing the light reproducing characteristics of an amorphous alloy thin film.

In FIG. 1, an optical reproduced output (S) and the signal to noise ratio (S/N) of an amorphous alloy thin film during optical reproducing are shown as functions of irradiated laser power ($I_0$) and, from FIG. 1, it is seen that the TbFe and DyFe having excellent characteristics as recording media are inferior in terms of optical reproduction to the GdFe which is not a good recording medium. This is a very serious defect when these recording media are used as magneto-optical memories.

To overcome the abovesaid defect of the amorphous alloy thin films, many efforts have been made in conventional art. One of solutions heretofore proposed is to provide a reflection film on the back of a magnetic thin film, thereby increasing apparent Kerr rotational angle to improve the SN ratio of reproduced light.

Figure 2:
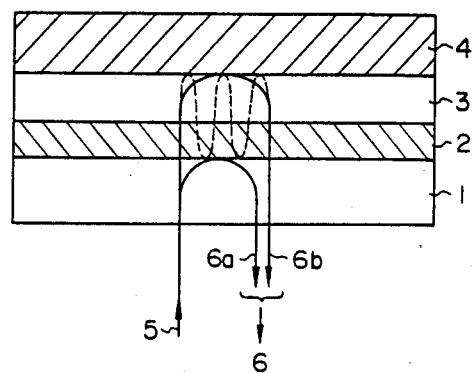
FIG. 2 is a longitudinal sectional view illustrating an example of a conventional magneto-optical recording medium.

This prior art example is shown in FIG. 2. In FIG. 2, reference numeral 1 indicates a glass substrate; 2 designates a recording medium layer made of TbFe, GdFe, GdTbFe, TbCoFe or the like; 3 identifies a dielectric layer as of SiO; and 4 denotes a reflection film as of Au, Ag, Al, Cu or the like. The action and operation of this structure have not yet been theoretically elucidated but, at present, are explained as follows: The path of incident light 5 from the side of the substrate 1 is roughly divided into two as shown. One is light 6a which is reflected near the surface of the recording medium layer 2 and the other is light 6b which passes through the recording medium layer 2 and is subjected to multiple reflection in the recording medium layer 2, the dielectric layer 3 or the both layers 2 and 3. Assuming that the incident light 5 is recording light, the dielectric layer 3 acts as a heat buffer layer for preventing that heat applied to the recording medium layer 2 is radiated to the reflection film 4 made of metal. Furthermore, the heat of the light 6b confined to the recording medium layer 2 and the dielectric layer 3 produces what is called a heat accumulating effect. By these two actions the power of the recording light can be reduced to a very small value.

Moreover, in the case of the incident light 5 being reproducing light, the light 6a is subjected to rotation of its plane of polarization owing to the magnetic Kerr effect which is produced in the recording medium 2. On the other hand, when passing through the recording medium layer 2, the light 6b is subjected to rotation of its plane of polarization owing to the Farady effect. By mutual interference of the two lights 6a and 6b, the apparent Kerr rotational angle of the output light 6 is increased, providing for improved S/N of the output light.

The inventor's experimental results reveal that the effect of improvement is produced especially in a case where an He-Ne laser having a wavelength ($\lambda$) of 6328 Å is used as a light source and the recording medium layer 2, the dielectric layer 3 and the reflection film 4 are formed to thicknesses of 220, 2500 and 400 Å or more, respectively.

On the other hand, since a grooved substrate may sometimes be required for tracking, the substrate 1 may preferably be formed of a highly reliable material which is excellent in workability and difficult to break. From this point of view, plastics is preferable to glass. Now, let it be assumed that the substrate in FIG. 2 is formed of plastics. Since the plastics is a material which is in itself permeable to air and water, it is considered that water in the environment permeates into the recording medium layer 2. In such a case, since the recording medium layer 2 is as thin as about 200 Å as referred to above, it rapidly oxidized. This is a strong factor lowering the long-term reliability of the substrate.

The present invention will hereinafter be described in detail.

Figure 3:
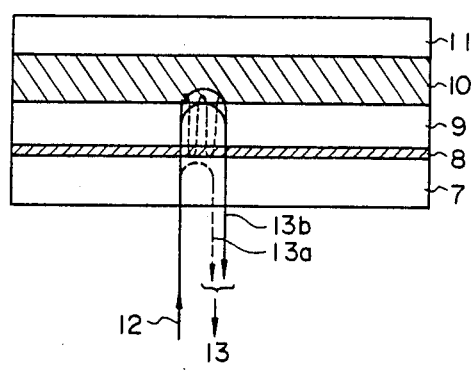
FIG. 3 is a longitudinal sectional view illustrating an embodiment of the present invention.

FIG. 3 illustrates an embodiment of the present invention. In FIG. 3, reference numeral 7 indicates a plastic substrate; 8 designates a light transparent thin film of a simple substance of metal, such as Au, Ag, Al, Cu or the like, or a metal compound, such as $CrO_2$ or the like; 9 identifies a dielectric layer as of SiO; 10 denotes a recording medium layer formed by an amorphous alloy thin film having an easy axis of magnetization in a direction perpendicular to the film surface; and 11 shows a protective layer which mainly prevents oxidation of the recording medium layer 10 for protecting it from the environment. In this embodiment, the metal thin film is adjusted to a thickness less than 300 Å because of the requirement for the passage therethrough of incident light 12 with a minimum attenuation. Furthermore, the recording medium layer 10 can be set to an arbitrary thickness because it need not pass the light therethrough unlike in case of FIG. 2. Accordingly, air or water having permeated into the plastic substrate 1 is almost prevented by the metal thin film 8 from further permeation into the substrate. Even if the air or water has permeated through the dielectric layer 9 or the protective layer 11 to reach the recording medium layer 10, sufficiently high reliabily against, oxidation can be obtained since the recording medium layer 10 can be set appreciably thick.

Next, a description will be given of the action of this embodiment. The incident light 12 is roughly divided into light 13a which is reflected by the metal thin film 8 and light 13b which passes through the metal thin film 8 and is subjected to multiple reflection between the metal thin film 8 and the recording medium 10, thereafter being output.

As is the case with the prior art example of FIG. 2, when the incident light 12 is recording light, the light confined between the recording medium layer 10 and the metal thin film 8 produces a heat accumulating effect, allowing reduction of the power of the recording light. In a case where the incident light 12 is reproducing light, it is possible to obtain output light 13 which has its apparent Kerr rotational angle increased by mutual interference of the light 13a reflected by the metal thin film 8 and the light 13b having its plane of polarization rotated owing to the magnetic Kerr effect and the Farady effect during multiple reflection between the metal thin film 8 and the recording medium layer 10, and the SN ratio of the output light can be improved.

Figure 4:
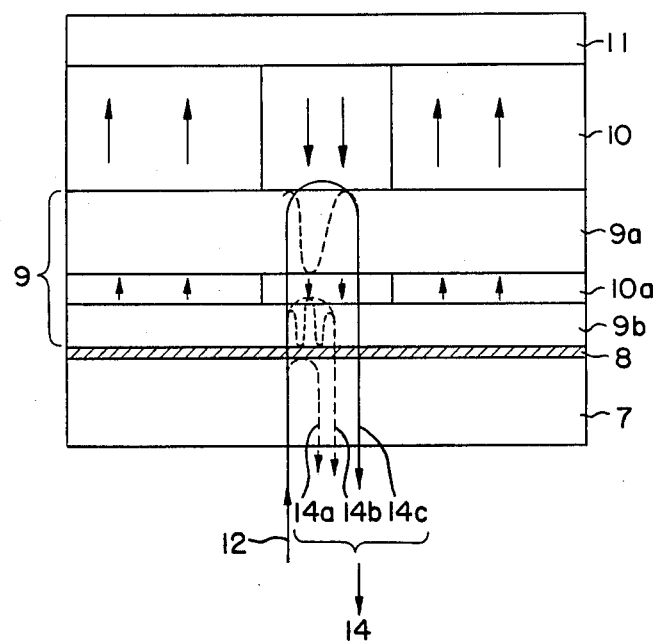
FIG. 4 is a longitudinal sectional view illustrating another embodiment of the present invention.

Referring next to FIG. 4, another embodiment of the present invention will be described. In this embodiment, an auxiliary recording medium layer 10a is provided in the dielectric layer 9, by which the apparent Kerr rotational angle can be further increased. During recording, the same information is written in the auxiliary recording medium layer 10a and the recording medium layer 10 because they are formed of the same material. This is shown by the arrows indicating the direction of magnetization in FIG. 4. When the reproducing light 12 is incident in this state, a portion of the incident light is reflected as light 14a by the metal thin film 8 and a portion of the light having passed therethrough is rotated in its plane of polarization owing to the Kerr effect in the auxiliary recording medium layer 10a and reflected as light 14b. On the other hand, the light having passed through the auxiliary recording medium layer 10a is rotated in its plane of polarization due to the Farady effect while passing through the layer 10a and when it reaches the recording medium layer 10, it is rotated in its plane of polarization owing to the Kerr effect and reflected as light 14c. Moreover, during multiple reflection between the recording medium layer 10, the auxiliary recording medium layer 10a and the metal thin film 8, it is rotated in its plane of polarization by the Kerr effect in both of the layers 10 and 10a and, in addition, it is subjected to the Farady effect when passing through the auxiliary recording medium layer 10a. Accordingly, the apparent Kerr rotational angle is increased by a combined output light 14 of the light components 14a, 14b and 14c obtained by the above actions as compared with that in the embodiment of FIG. 3.

As has been described in the foregoing, according to the present invention, it is possible to obtain a magneto-optical recording medium which produces a reproduced output light of high SN ratio and is high in long-term reliability and excellent in productivity.

Incidentally, the use of glass for the substrate 7 in the present invention would not cause any change in its characteristic.

What we claim is:

1. A magneto-optical recording thin film, in which a transparent synthetic resin substrate/defining a light incidence side, a light transparent thin film of metal or a metal compound, a dielectric layer, a recording medium layer formed of an amorphous alloy having an easy axis of magnetization in a direction perpendicular to the film surface and thick enough to reflect light, and a protective film are provided in this order from said light incidence side.

2. A magneto-optical recording thin film, in which a transparent synthetic resin substrate defining a light incidence side, a light transparent thin film of metal or metal compound, a dielectric layer, a recording medium layer formed of an amorphous alloy having an easy axis of magnetization in a direction perpendicular to the layer surface and thick enough to reflect light, and a protective layer are provided in this order from said light incidence side, the dielectric layer being provided an auxiliary recording medium layer formed of amorphous alloy having an easy axis of magnetization in the direction perpendicular to the thin film surface and thin enough to permit the passage therethrough of light and a second dielectric layer sandwiching the auxiliary recording medium layer in conjunction with the first-mentioned dielectric layer.

* * * * *